US006594368B2

(12) United States Patent
Finn

(10) Patent No.: US 6,594,368 B2
(45) Date of Patent: Jul. 15, 2003

(54) DVE SYSTEM WITH DYNAMIC RANGE PROCESSING

(75) Inventor: Brian M. Finn, Madison, WI (US)

(73) Assignee: Digisonix, LLC, Stoughton, WI (US)

( * ) Notice: Subject to any disclaimer, the term of this patent is extended or adjusted under 35 U.S.C. 154(b) by 2 days.

(21) Appl. No.: 09/790,409

(22) Filed: Feb. 21, 2001

(65) Prior Publication Data

US 2002/0114474 A1 Aug. 22, 2002

(51) Int. Cl.[7] .......................... H04R 3/00; H04R 27/00; H03G 3/00

(52) U.S. Cl. .......................... 381/111; 107/104; 107/83

(58) Field of Search ............................ 381/111, 83, 93, 381/104, 107–108, 106

(56) References Cited

U.S. PATENT DOCUMENTS

| | | | | | |
|---|---|---|---|---|---|
| 4,736,431 | A | | 4/1988 | Allie et al. | 381/71.8 |
| 4,837,834 | A | | 6/1989 | Allie | 381/71.14 |
| 5,033,082 | A | | 7/1991 | Eriksson et al. | 379/392 |
| 5,172,416 | A | | 12/1992 | Allie et al. | 381/71.11 |
| 5,357,609 | A | * | 10/1994 | Sellers et al. | 395/200 |
| 5,396,561 | A | | 3/1995 | Popovich et al. | 381/71.11 |
| 5,396,562 | A | * | 3/1995 | Ishimitsu et al. | 381/107 |
| 5,602,928 | A | | 2/1997 | Eriksson et al. | 381/71.4 |
| 5,631,968 | A | * | 5/1997 | Frey et al. | 381/106 |
| 5,706,344 | A | | 1/1998 | Finn | 381/71.11 |
| 5,715,320 | A | | 2/1998 | Allie et al. | 381/71.12 |
| 5,910,994 | A | * | 6/1999 | Lane et al. | 381/93 |
| 6,107,879 | A | * | 8/2000 | Hoshino et al. | 381/106 |
| 6,122,384 | A | * | 9/2000 | Mauro | 381/94.1 |
| 6,295,364 | B1 | * | 9/2001 | Finn et al. | 381/110 |

* cited by examiner

*Primary Examiner*—Minsun Oh Harvey
*Assistant Examiner*—Laura A. Grier
(74) *Attorney, Agent, or Firm*—Andrus, Sceales, Starke & Sawall, LLP

(57) ABSTRACT

A digital voice enhancement, DVE, communication system includes a dynamic range processor and method altering dynamic range of the electrical signal from the microphone to the loudspeaker by applying nonlinear and/or differential gain thereto, preferably applied by a slope intercept formula.

16 Claims, 1 Drawing Sheet

DVE SYSTEM WITH DYNAMIC RANGE PROCESSING

BACKGROUND AND SUMMARY OF THE INVENTION

The invention relates to digital voice enhancement, DVE, communication systems, and more particularly to improvements enabling increased gain.

The invention is applicable to DVE systems, including duplex systems, for example as shown in U.S. Pat. No. 5,033,082, and in U.S. application Ser. No. 08/927,874, filed Sep. 11, 1997, simplex systems, for example as shown in U.S. application Ser. No. 09/050,511, filed Mar. 30, 1998, all incorporated herein by reference, and other systems. The DVE communication system includes a first acoustic zone, a second acoustic zone, a microphone at the first zone, and a loudspeaker at the second zone and electrically coupled to the microphone such that the speech of a person at the first zone can be heard by a person at the second zone as transmitted by an electrical signal from the microphone to the loudspeaker.

Speech signals tend to have large peak-to-rms (root mean square) ratios, which define the signal levels permissible before hardware clipping, and the energy levels contained within those signals. Often when processing speech signals it is desired for more rms energy at the output of the signal path. This is usually accomplished by increasing the signal gain in a linear fashion. At some limit the speech signals can no longer have gain added to them, and they will clip analog electronics and/or saturate numerical processes.

In the present invention, the dynamic range of the electrical signal from the microphone is altered, to effectively allow more gain to be added to small signals increasing the rms level while limiting the peaks of the large signals by adding less gain preventing hard clipping. Nonlinear and/or differential gain is applied. In one embodiment, a slope intercept formula is used to calculate gain of the speech input signal when the signal passes a designated threshold, which formula is preferably a soft clipping algorithm. If the speech input signal is less than the threshold, a unity linear gain is applied, and the signal passes through the process unaffected. Typically a net gain is added downstream of the soft clipping process before transmission to the loudspeaker. The system allows the gain to be increased for low level signals, e.g. soft talkers, and limited for high level signals, e.g. loud talkers. The system reduces the problem of talker level dependency for the effectiveness of the DVE system.

DETAILED DESCRIPTION OF THE INVENTION

Figure 1:
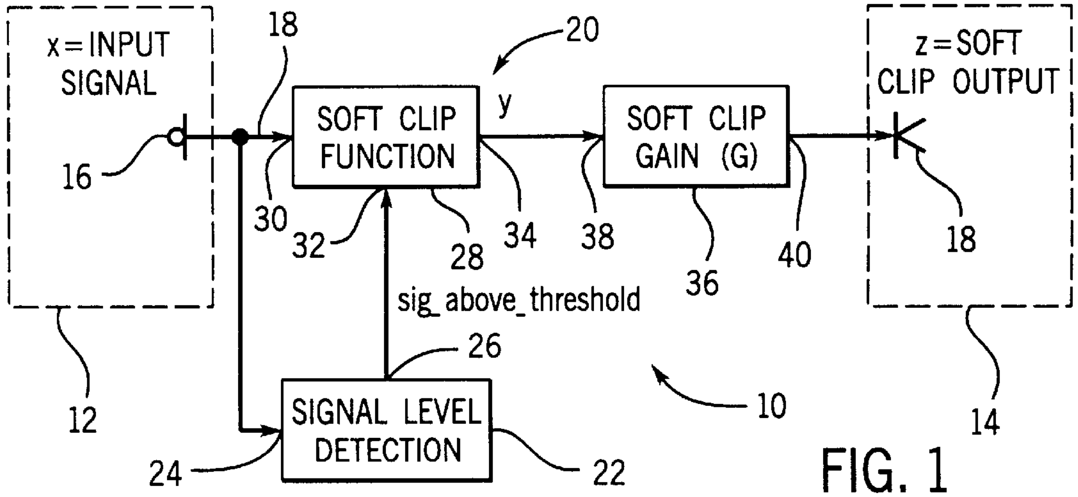
FIG. 1 illustrates a DVE system in accordance with the invention.

FIG. 1 shows a digital voice enhancement, DVE, communication system 10 including a first acoustic zone 12, a second acoustic zone 14, a microphone 16 at zone 12, and a loudspeaker 18 at zone 14 and electrically coupled by channel or line 18 to microphone 16 such that the speech of a person at zone 12 can be heard by a person at zone 14 as transmitted by an electrical signal on line 18 from microphone 16 to loudspeaker 18. A dynamic range processor 20 alters the dynamic range of the electrical signal by applying nonlinear gain thereto. The dynamic range processor adds smaller gain to larger signals, and larger gain to smaller signals, to limit peaks of the larger signals and prevent hard clipping thereof, and to increase rms level of the smaller signals. The nonlinear gain preferably has a transition at a given threshold of the electrical signal, to be described, and applies a first gain factor below the threshold, and a second different gain factor above the threshold, to provide differential gain. The first gain factor is constant. The second gain factor is variable.

Dynamic range processor 20 includes a signal level detector 22 having an input 24 from the electrical signal from microphone 16, and an output 26. Output 26 has a first state when the electrical signal at input 24 is below a designated threshold, and a second state when the electrical signal at input 24 is above the threshold. Dynamic range processor 20 includes a first gain element 28 having a first input 30 from the electrical signal from microphone 16, a second input 32 from output 26 of signal level detector 22, and an output 34. Gain element 28 applies a first gain factor to the electrical signal at first input 30 when the second input 32 receives the noted first state from output 26 of signal level detector 22. Gain element 28 applies a second different gain factor to the electrical signal at first input 30 when second input 32 receives the noted second state from output 26 of signal level detector 22. Dynamic range processor 20 includes a second gain element 36 having an input 38 from output 34 of first gain element 28, and having an output 40 to loudspeaker 18. Gain element 36 applies a third gain factor to the electrical signal at input 38 for transmission to loudspeaker 18. The electrical signal from microphone 16 is supplied in parallel to input 24 of signal level detector 22 and to input 30 of gain element 28. Gain elements 28 and 36 are in series with each other and in series between microphone 16 and loudspeaker 18. The noted second gain factor applied by gain element 28 is less than the noted first gain factor applied by element 28, to apply smaller gain to the larger signals, and larger gain to the smaller signals, and to enable a larger third gain factor to be applied by gain element 36 than otherwise possible without the noted second gain factor, to increase rms level of the smaller signals without hard clipping of the larger signals. In the preferred embodiment, for simplicity, the noted first gain factor is unity such that the electrical signal passes through first gain element 28 unaffected when below the noted threshold. Further preferably, the noted first and third gain factors are constant, and the noted second gain factor is variable.

In preferred form, dynamic range processor 20 processes the input from microphone 16 according to a slope intercept formula when the input is above a given threshold. When x is greater than the given threshold, $$y(x)=mx+b$$

where x is the first input 30 to first gain element 28, y is output 34 of first gain element 28, m is slope, and b is y-intercept. When x is less than the given threshold, $$y(x)=x.$$

The noted slope m and y-intercept b are selected as a soft clip slope and soft clip y-intercept, respectively, such that the electrical signal from microphone 16 is compressed while retaining the shape thereof to prevent hard clipping of the peaks, which would otherwise result in a change of shape thereof, i.e. m and b are selected to compress the electrical signal while also retaining the shape thereof including peaks. Output y is supplied through gain element 36 to loudspeaker 18, which gain element applies a gain factor larger than otherwise possible without the slope intercept formula, to enable increase rms level of smaller signals without hard clipping of peaks of larger signals. Slope m is preferably less than 1, and b is selected to provide the noted transition between the noted first and second gain factors. The noted first gain factor is $y(x)=x$. The noted second gain factor is $y(x)=mx+b$. The input 38 to second gain element 36 is y. The output 40 of second gain element 36 is z and is supplied to loudspeaker 18.

Figure 2:
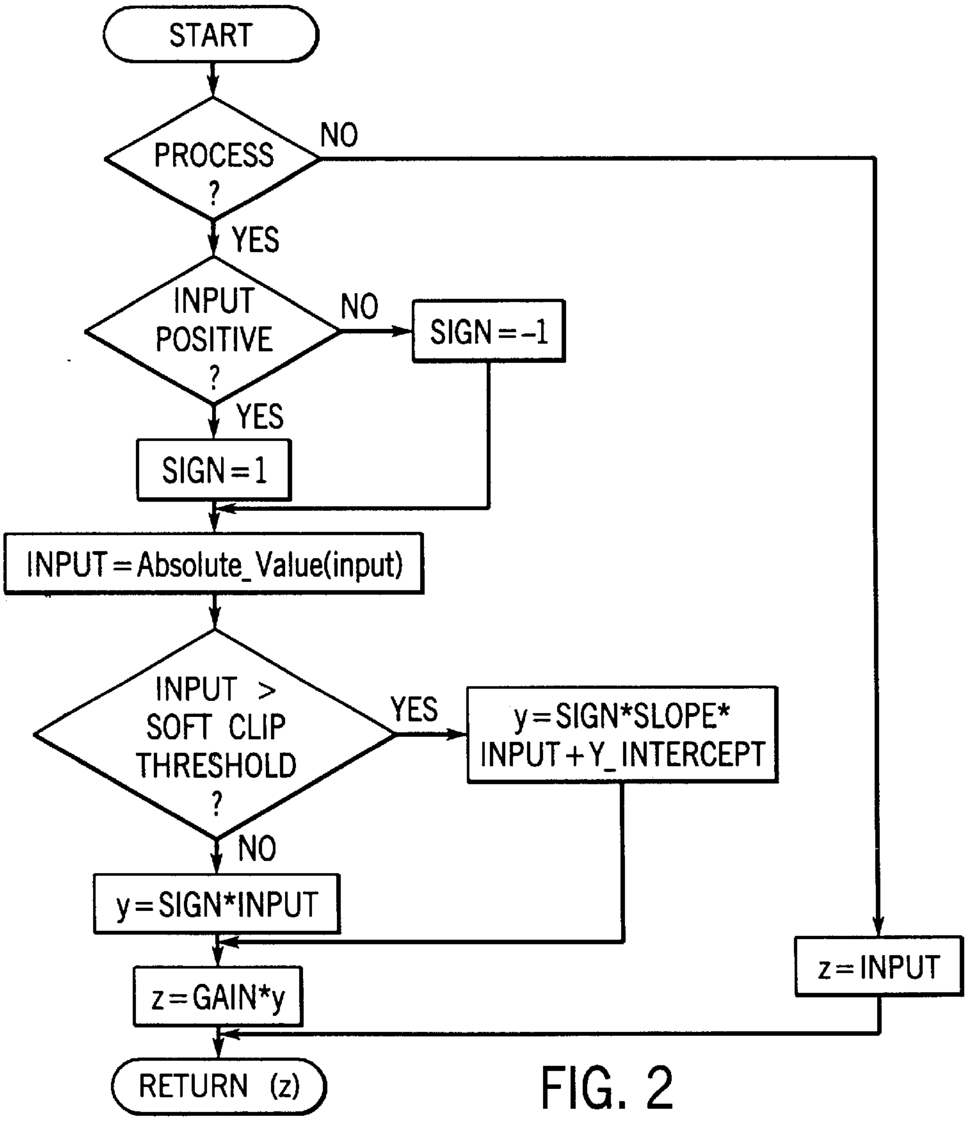
FIG. 2 illustrates a DVE method in accordance with the invention.

FIG. 2 illustrates the processing method. At the start, activity on microphone 16 is sampled, and if there is none, then the output z is equal to the input. If there is activity on microphone 16, the process determines whether the input is positive or negative, and if negative, a sign change is instituted, and if positive, the sign stays the same. The absolute value of the input is then compared against a designated soft clip threshold, and if greater than the threshold, the slope intercept formula is applied to apply the noted second gain factor, and if below the threshold, the noted first unity gain factor is applied. The noted third gain factor is then applied to y by gain element 36 to provide the noted z output.

It is recognized that various equivalents, alternatives and modifications are possible within the scope of the appended claims.

What is claimed is:

1. A digital voice enhancement communication system comprising:

a first acoustic zone;

a second acoustic zone;

a microphone at said first zone;

a loudspeaker at said second zone and electrically coupled to said microphone such that the speech of a person at said first zone can be heard by a person at said second zone as transmitted by an electrical signal from said microphone to said loudspeaker;

a dynamic range processor having an input from said microphone and an output to said loudspeaker and processing said input according to a slope intercept formula when said input is above a given threshold, wherein said input is x, said output is y, and when x is greater than said given threshold, $$y(x)=mx+b$$

where m is slope, and b is y-intercept, and when x is less than said given threshold, $$y(x)=x.$$

2. The invention according to claim 1 wherein m and b are selected as a soft clip slope and soft clip y-intercept, respectively, such that said electrical signal is compressed while retaining the shape thereof to prevent hard clipping of the peaks thereof which would otherwise result in a change of shape thereof.

3. The invention according to claim 1 wherein m and b are selected as a soft clip slope and soft clip y-intercept, respectively, to compress said electrical signal while also retaining the shape thereof including peaks.

4. The invention according to claim 1 wherein y is supplied through a gain element to said loudspeaker, said gain element applying a gain factor larger than otherwise possible without said slope intercept formula, to enable increased rms level of smaller signals without hard clipping of peaks of larger signals.

5. The invention according to claim 1 wherein $m<1$.

6. The invention according to claim 1 wherein said dynamic range processor comprises:

a signal level detector having an input from said electrical signal from said microphone, and having an output, said output having a first state when said electrical signal at said input of said detector is below a designated threshold, said output having a second state when said electrical signal at said input of said signal level detector is above said threshold;

a first gain element having a first input from said electrical signal from said microphone, a second input from said output of said signal level detector, and an output, said first gain element applying a first gain factor to said electrical signal at said first input of said first gain element when said second input of said first gain element receives said first state from said output of said signal level detector, said first gain element applying a second different gain factor to said electrical signal at said first input of said first gain element when said second input of said first gain element receives said second state from said output of said signal level detector;

a second gain element having an input from said output of said first gain element, and having an output to said loudspeaker, said second gain element applying a third gain factor to said electrical signal at said input of said second gain element for transmission to said loudspeaker;

said first input to said first gain element is x;

said output of said first gain element is y;

said first gain factor is $y(x)=x$;

said second gain factor is $y(x)=mx+b$;

said input to said second gain element is y;

said output of said second gain element is z and is supplied to said loudspeaker.

7. A method for processing an electrical signal in a digital voice enhancement communication system having a first acoustic zone, a second acoustic zone, a microphone at said first zone, a loudspeaker at said second zone and electrically coupled to said microphone such that the speech of a person at said first zone can be heard by a person at said second zone as transmitted by an electrical signal from said microphone to said loudspeaker, said method comprising altering dynamic range of said electrical signal by applying at least one of nonlinear and differential gain thereto, and comprising:

detecting the level of said electrical signal from said microphone with a signal level detector having an input from said electrical signal from said microphone, providing said signal level detector with an output having a first state when said electrical signal is below a designated threshold, and having a second state when said electrical signal is above said threshold;

selectively applying first and second gain factors to said electrical signal from said microphone at a first gain element having a first input from said electrical signal from said microphone, a second input from said output of said signal level detector, and having an output, applying said first gain factor to said electrical signal at said first input of said first gain element when said second input of said first gain element receives said first state from said output of said signal level detector, applying a second different gain factor to said electrical signal at said first input of said first gain element when said second input of said first gain element receives said second state from said output of said signal level detector;

applying a third gain factor to said electrical signal by a second gain element having an input from said output of said first gain element, and an output to said loudspeaker, applying said third gain factor to said electrical signal at said input of said second gain element for transmission to said loudspeaker.

8. The method according to claim 7 comprising applying said electrical signal from said microphone in parallel to said first input of said first gain element and to said input of said signal level detector, applying said gain factors in series to said electrical signal by supplying said first and second gain elements in series with each other and in series between said microphone and said loudspeaker.

9. The method according to claim 7 comprising applying a larger said second gain factor than said first gain factor, to apply smaller gain to larger signals, and larger gain to smaller signals, to enable a larger said third gain factor, to increase rms level of said smaller signals without hard clipping of peaks of said larger signals.

10. The method according to claim 7 comprising applying said first gain factor as unity, and passing said electrical signal through said first gain element unaffected when below said threshold.

11. The method according to claim 7 comprising applying constant said first and third gain factors, and a variable said second gain factor.

12. A method for processing an electrical signal in a digital voice enhancement communication system having a first acoustic zone, a second acoustic zone, a microphone at said first zone, a loudspeaker at said second zone and electrically coupled to said microphone such that the speech of a person at said first zone can be heard by a person at said second zone as transmitted by an electrical signal from said microphone to said loudspeaker, said method comprising processing said electrical signal from said microphone according to a slope intercept formula when said electrical signal is above a given threshold, and comprising processing said electrical signal according to $$y(x)=mx+b$$

where x is the electrical signal from said microphone, y is the electrical signal sent to said loudspeaker, m is slope, and b is y-intercept, and comprising supplying y as x, namely y(x)=x, when x is below said given threshold.

13. A method for processing an electrical signal in a digital voice enhancement communication system having a first acoustic zone, a second acoustic zone, a microphone at said first zone, a loudspeaker at said second zone and electrically coupled to said microphone such that the speech of a person at said first zone can be heard by a person at said second zone as transmitted by an electrical signal from said microphone to said loudspeaker, said method comprising processing said electrical signal from said microphone according to a slope intercept formula when said electrical signal is above a given threshold, and comprising processing said electrical signal according to $$y(x)=mx+b$$

where x is the electrical signal from said microphone, y is the electrical signal sent to said loudspeaker, m is slope, and b is y-intercept, and comprising applying said slope intercept formula when the absolute value of x is above said threshold.

14. A method for processing an electrical signal in a digital voice enhancement communication system having a first acoustic zone, a second acoustic zone, a microphone at said first zone, a loudspeaker at said second zone and electrically coupled to said microphone such that the speech of a person at said first zone can be heard by a person at said second zone as transmitted by an electrical signal from said microphone to said loudspeaker, said method comprising processing said electrical signal from said microphone according to a slope intercept formula when said electrical signal is above a given threshold, and comprising processing said electrical signal according to $$y(x)=mx+b$$

where x is the electrical signal from said microphone, y is the electrical signal sent to said loudspeaker, m is slope, and b is y-intercept, and comprising selecting m and b as soft clip slope and soft clip y-intercept, respectively, such that said electrical signal is compressed while retaining the shape thereof to prevent hard clipping of the peaks thereof which would otherwise result in a change of shape thereof.

15. A method for processing an electrical signal in a digital voice enhancement communication system having a first acoustic zone, a second acoustic zone, a microphone at said first zone, a loudspeaker at said second zone and electrically coupled to said microphone such that the speech of a person at said first zone can be heard by a person at said second zone as transmitted by an electrical signal from said microphone to said loudspeaker, said method comprising processing said electrical signal from said microphone according to a slope intercept formula when said electrical signal is above a given threshold, and comprising processing said electrical signal according to $$y(x)=mx+b$$

where x is the electrical signal from said microphone, y is the electrical signal sent to said loudspeaker, m is slope, and b is y-intercept, and comprising supplying y through a gain element to said loudspeaker, and applying at said gain element a gain factor larger than otherwise possible without said slope intercept formula, to enable increased rms level of smaller signals without hard clipping of peaks of larger signals.

16. A method for processing an electrical signal in a digital voice enhancement communication system having a first acoustic zone, a second acoustic zone, a microphone at said first zone, a loudspeaker at said second zone and electrically coupled to said microphone such that the speech of a person at said first zone can be heard by a person at said second zone as transmitted by an electrical signal from said microphone to said loudspeaker, said method comprising processing said electrical signal from said microphone according to a slope intercept formula when said electrical signal is above a given threshold, and processing said electrical signal according to $$y(x)=mx+b$$

where x is the electrical signal from said microphone, y is the electrical signal sent to said loudspeaker, m is slope, and b is y-intercept, and comprising:

detecting the level of said electrical signal from said microphone with a signal level detector having an input from said electrical signal from said microphone, providing said signal level detector with an output having a first state when said electrical signal is below a designated threshold, and having a second state when said electrical signal is above said threshold;

selectively applying first and second gain factors to said electrical signal from said microphone at a first gain element having a first input from said electrical signal from said microphone, a second input from said output of said signal level detector, and having an output, applying said first gain factor to said electrical signal at said first input of said first gain element when said second input of said first gain element receives said first state from said output of said signal level detector, applying a second different gain factor to said electrical signal at said first input of said first gain element when said second input of said first gain element receives said second state from said output of said signal level detector;

applying a third gain factor to said electrical signal by a second gain element having an input from said output of said first gain element, and an output to said loudspeaker, applying said third gain factor to said electrical signal at said input of said second gain element for transmission to said loudspeaker, wherein:

said first input to said first gain element is x;

said output of said first gain element is y;

said first gain factor is $y(x)=x$;

said second gain factor is $y(x)=mx+b$;

said input to said second gain element is y;

said output of said second gain element is z and is supplied to said loudspeaker.

* * * * *